(12) United States Patent
Morimoto et al.

(10) Patent No.: US 10,481,509 B2
(45) Date of Patent: Nov. 19, 2019

(54) VIBRATION DAMPING APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Yoshihiro Morimoto, Utsunomiya (JP); Hiromichi Hara, Utsunomiya (JP); Masahiko Ogawa, Utsunomiya (JP); Ryo Takai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/291,119

(22) Filed: Mar. 4, 2019

(65) Prior Publication Data

US 2019/0278185 A1 Sep. 12, 2019

(30) Foreign Application Priority Data

Mar. 8, 2018 (JP) .................................. 2018-042301

(51) Int. Cl.
*G03F 7/20* (2006.01)
*G02B 7/02* (2006.01)

(52) U.S. Cl.
CPC ............. *G03F 7/709* (2013.01); *G02B 7/026* (2013.01)

(58) Field of Classification Search
CPC ............. G03F 7/70725; G03F 7/70825; G03F 7/7015; G03F 7/709
USPC ................................................ 355/53, 67, 72
See application file for complete search history.

(56) References Cited

U.S. PATENT DOCUMENTS

| 9,513,452 B2 | 12/2016 | Vogler et al. | |
| 2011/0032496 A1* | 2/2011 | Shibazaki | G03F 7/707 355/30 |
| 2014/0049763 A1* | 2/2014 | Miyakawa | G03F 7/70716 355/72 |
| 2014/0185029 A1* | 7/2014 | Kwan | G03F 7/70825 355/72 |

FOREIGN PATENT DOCUMENTS

| JP | 5017494 B2 | 9/2012 |
| WO | 2010083965 A1 | 7/2010 |

* cited by examiner

*Primary Examiner* — Hung Nguyen
(74) *Attorney, Agent, or Firm* — Rossi, Kimms & McDowell LLP (57) ABSTRACT

The present invention provides a vibration damping apparatus that performs vibration damping of a first optical element among a plurality of optical elements arranged in a barrel, comprising: a holding member connected to the barrel and configured to hold the first optical element; and a mass body supported by the holding member via a damper element, wherein the mass body includes a second optical element different from the first optical element among the plurality of optical elements.

25 Claims, 7 Drawing Sheets

FIG. 9

VIBRATION DAMPING APPARATUS, LITHOGRAPHY APPARATUS, AND METHOD OF MANUFACTURING ARTICLE

BACKGROUND OF THE INVENTION

Field of the Invention

The present invention relates to a vibration damping apparatus, a lithography apparatus, and a method of manufacturing an article.

Description of the Related Art

Along with the advancement in miniaturization and integration of a pattern to be formed on a substrate, there is a demand for reducing the vibration of an optical element (such as a lens) in a lithography apparatus used for manufacturing a semiconductor device or the like. Japanese Patent No. 5017494 proposes a vibration damping apparatus in which a plurality of damping masses, which are supported by a holder for holding an optical element via damper elements, are coupled by coupling elements.

For example, in an optical system, such as an illumination optical system or a projection optical system, which is used in an exposure apparatus, a plurality of optical elements can be arranged at small intervals in a barrel to obtain desired optical performance. Therefore, from the point of view of the arrangement space, it will be difficult to arrange, for each of a plurality of optical elements in a barrel, a vibration damping apparatus such as that disclosed in Japanese Patent No. 5017494 having the arrangement in which the plurality of damping masses coupled by coupling elements are provided in a holder for holding an optical element.

SUMMARY OF THE INVENTION

The present invention provides, for example, a technique advantageous in the point of reducing a pattern transfer defect on a substrate.

According to one aspect of the present invention, there is provided a vibration damping apparatus that performs vibration damping of a first optical element among a plurality of optical elements arranged in a barrel, comprising: a holding member connected to the barrel and configured to hold the first optical element; and a mass body supported by the holding member via a damper element, wherein the mass body includes a second optical element different from the first optical element among the plurality of optical elements.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. In addition, although an exposure apparatus that exposes a substrate to transfer a mask pattern onto the substrate will be used as a lithography apparatus for forming a pattern on a substrate in the embodiments hereinafter, the present invention is not limited to this. The present invention is applicable to a case in which vibration damping (vibration control) is performed on an optical element included in a lithography apparatus such as, for example, an imprint apparatus configured to form an imprint material pattern on a substrate by using a mold or a drawing apparatus configured to form a pattern on a substrate by a charged particle beam.

Figure 1:
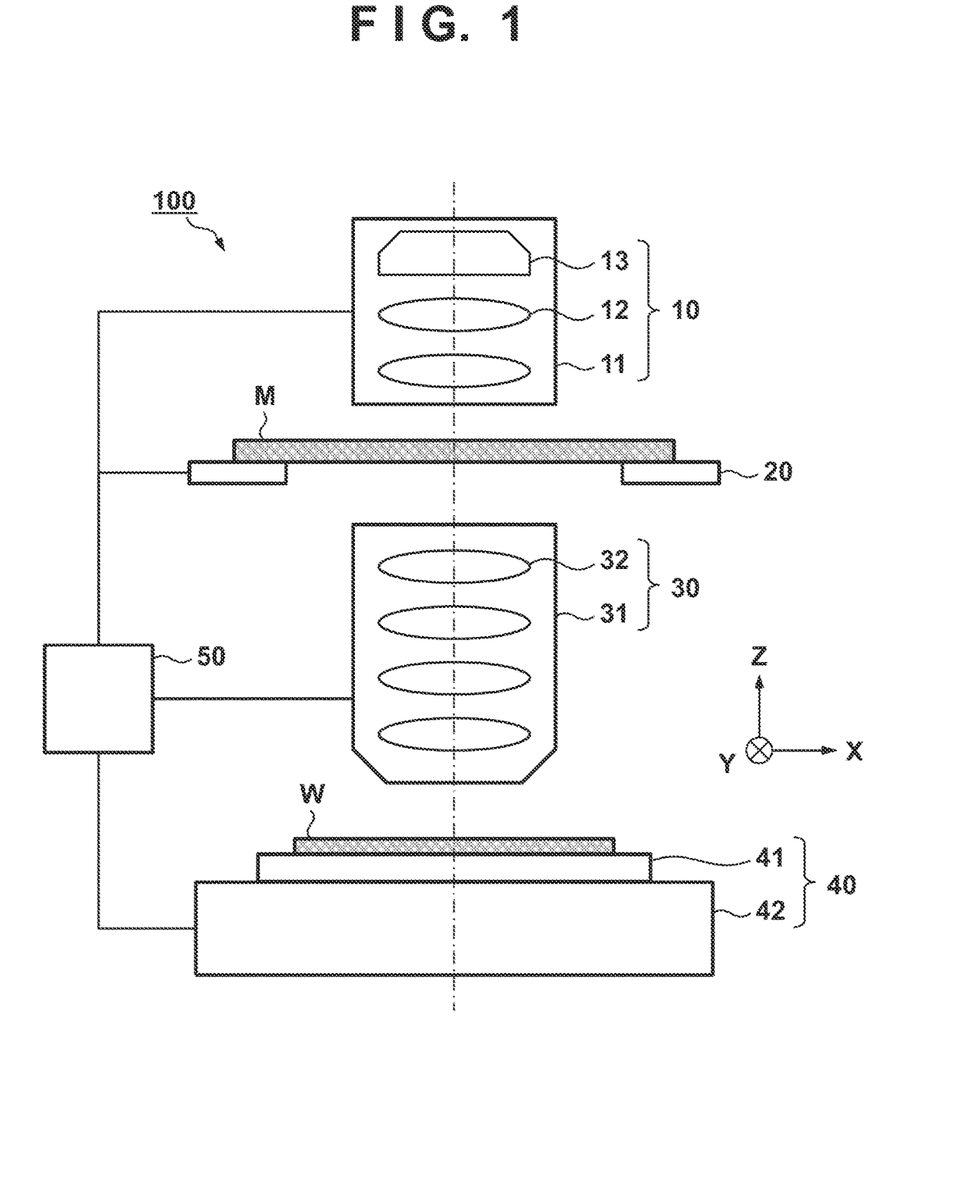
FIG. 1 is a schematic view showing the arrangement of an exposure apparatus.

FIG. 1 is a schematic view showing the arrangement of an exposure apparatus 100. The exposure apparatus 100 can include an illumination optical system 10, a mask stage 20 configured to hold a mask M, a projection optical system 30, a substrate stage 40 configured to hold a substrate W, and a control unit 50. The illumination optical system 10 includes, for example, a barrel 11 and a plurality of optical elements 12 which are arranged in the barrel, and uses light emitted from a light source 13 to illuminate the mask M held by the mask stage 20. For example, a lens, a mirror, a diffraction grating, a parallel plate, or the like can be used as each optical element 12 of the illumination optical system 10. The projection optical system 30 includes, for example, a barrel 31 and a plurality of optical elements 32 arranged in the barrel, and projects a pattern of the mask M onto the substrate at a predetermined projection magnification. For example, a lens, a mirror, a diffraction grating, a parallel plate, or the like can be used as each optical element 32 in the projection optical system 30. The substrate stage 40 includes, for example, a substrate chuck 41 configured to hold the substrate W and a substrate driving unit 42 configured to drive the substrate chuck 41 (the substrate W), and is formed to be movable in a direction (X-Y direction) perpendicular to the optical axis of the projection optical system 30. The control unit 50 is formed by, for example, a computer which includes a CPU, a memory, and the like, and the control unit executes a process of transferring the pattern of the mask M onto the substrate W (process of exposing the substrate) by controlling each unit of the exposure apparatus 100.

Along with the increasing miniaturization and integration of the pattern to be formed on a substrate, the exposure apparatus 100 arranged in this manner is required to accurately form a pattern on the substrate while reducing the vibration that occurs in the optical elements of the illumination optical system 10 and the projection optical system 30. Therefore, in the exposure apparatus 100, a vibration damping apparatus for reducing the vibration of each optical element can be arranged in the barrel of the illumination optical system 10 or the projection optical system 30. A vibration damping apparatus according to the present invention will be described hereinafter. Although a vibration damping apparatus for reducing the vibration of the optical elements 32 of the projection optical system 30 will be described hereinafter, the vibration damping apparatus can be applied also to the optical elements 12 of the illumination optical system 10.

First Embodiment

Figure 2:
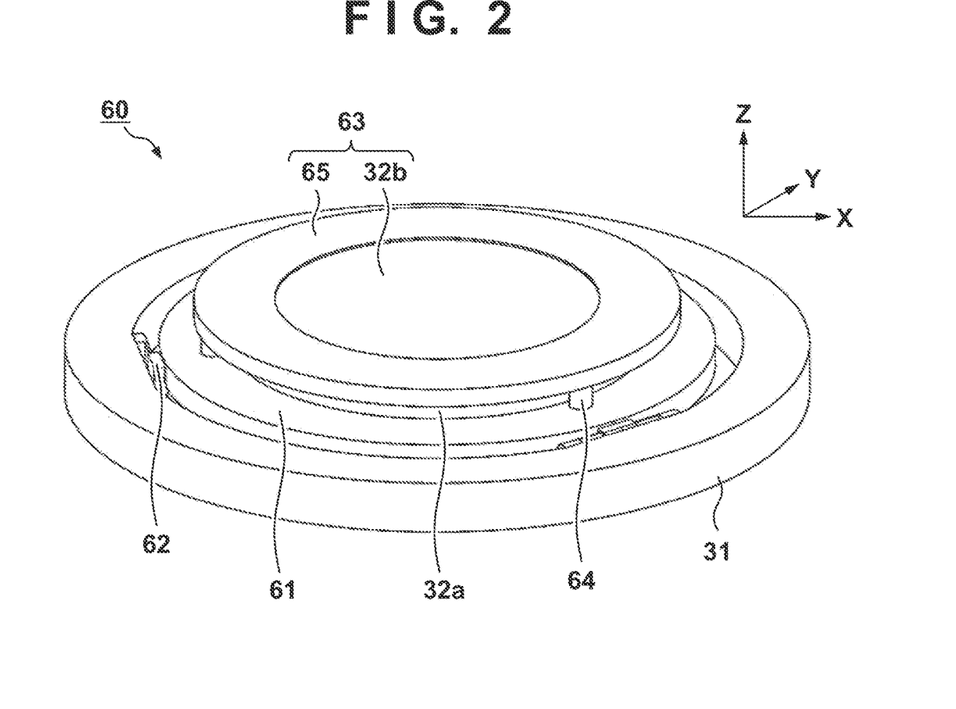
FIG. 2 is a perspective view showing an example of the arrangement of a vibration damping apparatus according to the first embodiment.
Figure 3:
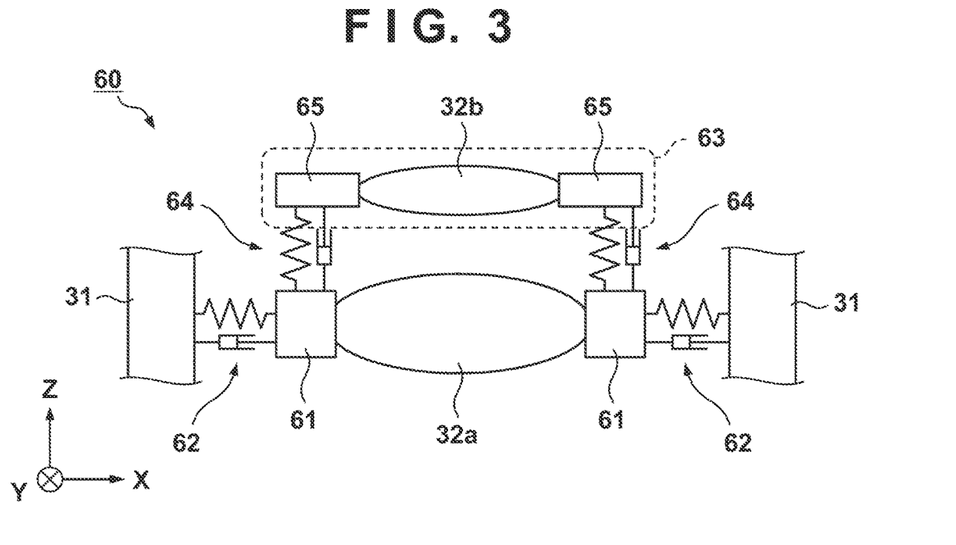
FIG. 3 is a schematic sectional view showing an example of the arrangement of the vibration damping apparatus according to the first embodiment.

A vibration damping apparatus 60 according to the first embodiment will be described with reference to FIGS. 2 and 3. FIG. 2 is a perspective view showing an example of the arrangement of the vibration damping apparatus 60 according to this embodiment, and FIG. 3 is a schematic sectional view showing an example of the arrangement of the vibration damping apparatus 60 according to this embodiment.

The vibration damping apparatus 60 according to this embodiment can include, for example, a first holding member 61 that holds an optical element 32a (first optical element) and connecting members 62 that connect the first holding member 61 to a barrel 31. The vibration damping apparatus 60 can include, as damping mass, a mass body 63 which is supported by the first holding member 61 via damper elements 64. The vibration transmitted from the barrel 31 to the optical element 32a and an optical element 32b can be quickly reduced by the natural frequency of the mass body 63 which is supported by the damper elements 64 be different from the natural frequency (for example, 150 to 200 Hz) of the first optical element 32a which is supported by the connecting members 62. The mass body 63 according to this embodiment includes the optical element 32b (second optical element) different from the optical element 32a (first optical element) and a second holding member 65 that holds the optical element 32b, and the second holding member 65 is supported by the first holding member 61 via the damper elements 64. By employing such an arrangement, it becomes possible to perform vibration damping on the optical element 32a and the optical element 32b by using the mass of each optical element without having to arrange a structure in the narrow space between the optical element 32a and the optical element 32b which are adjacent to each other.

An example of the arrangement of the elements of the vibration damping apparatus 60 will be described next. The first holding member 61 is a member formed, for example, in a ring shape so as to hold the periphery (for example, a region other than the region for transmitting light) of the optical element 32a. This first holding member 61 can be made from a ceramic or a low-thermal expansion metal having a thermal expansion coefficient equal to or less than $10^{-6}$ (1/K) (a low-thermal expansion material whose thermal expansion coefficient is equal to or less than $10^{-3}$ (1/K), more preferably equal to or less than $10^{-6}$ (1/K)). Although one of an adhesive method, a mechanical coupling method, and an intermolecular coupling method can be used as the connection method of the first holding member 61 and the optical element 32a, it is also possible to use a connection method other than these methods. Also, in the same manner as the first holding member 61, the second holding member 65 is a member formed, for example, in a ring shape so as to hold the periphery of the optical element 32b and can be made of a ceramic or a low-thermal expansion metal having a thermal expansion coefficient equal to or less than $10^{-6}$ (1/K). Although one of an adhesive method, a mechanical coupling method, and an intermolecular coupling method can be used as the connection method of the second holding member 65 and the optical element 32b, it is also possible to use a connection method other than these methods.

In this case, it is preferable to use, as the optical element 32b held by the second holding member 65, an optical element whose optical sensitivity with respect to a positional error (for example, the changing amount of optical characteristics with respect to a positional fluctuation amount) is lower than that of the optical element 32a held by the first holding member 61. In addition, the optical element 32a held by the first holding member 61 and the optical element 32b held by the second holding member 65 can have different masses from each other or can have different refractive powers from each other. It is preferable, for example, for the optical element 32b to use an optical element whose mass and refractive power are smaller than those of the optical element 32a.

Each connecting member 62 can be formed so as to have rigidity to support the optical element 32a (the first holding member 61) to constrain the six degrees of freedom, and have an attenuation characteristic that can attenuate the vibration transmitted between the barrel 31 and the optical element 32a (the first holding member 61). That is, the connecting member 62 can be formed from an object that has a spring constant K and an attenuation coefficient C, and can be formed so that the distortion generated in the optical element 32a will be reduced by reducing the deformation transmission from the barrel 31 to the optical element 32a (the first holding member 61). Although the connecting member 62 can be arranged in each of a plurality of locations (for example, four locations) between the barrel 31 and the first holding member 61, the arrangement location of the connecting member 62 can be changed arbitrarily in accordance with the rigidity of the connecting member 62 and the mode of the vibration which is to be damped. In addition, the connecting member 62 may have a ring shape centered about the optical axis of the projection optical system 30 and may be arranged between the barrel 31 and the first holding member 61.

A metal spring, a ceramic, a resin, a viscoelastic member (for example, a rubber member, preferably fluororubber with comparatively low outgas), a single fibrous-material member, or a combination of these can be used as each connecting member 62. A material obtained by weaving metallic fibers and carbon fibers can be enumerated as an example of a fibrous material. Alternatively, an active mass damper may be arranged by using an actuator such as a piezoelectric element as the connecting member 62. Each connecting member 62 formed in this manner may be directly attached to the barrel 31 and the first holding member 61 by an adhesive, a bolt, or the like or may be indirectly attached to the barrel and the first holding member via an elastic member such as a rubber sheet. Note that in addition to the X direction, the Y direction, and the Z direction, the six degrees of freedom include the rotational directions about these directions as the respective axes.

In addition, assume that each damper element 64 has a cylindrical shape, is arranged between without a gap between the first holding member 61 and the second holding member 65, and has a shape (arrangement) that forms a sealed space between the optical element 32a and the optical element 32b. In this case, there is a concern that the optical performance will be influenced by the change in the deformation state of each optical element due to a pressure difference between the external pressure and this sealed space (that is, the difference between the pressure in the sealed space and the external pressure when the external pressure has changed). In such a case, a through hole may be provided in the first holding member 61 or the second holding member 65 so the pressure difference with the outside will not be generated.

Figure 4A:
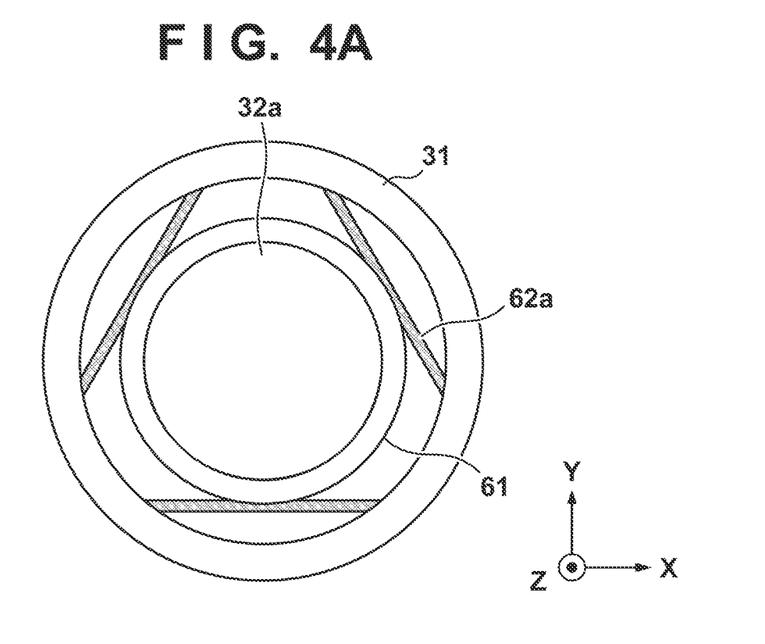
FIGS. 4A and 4B are views each showing an example of connecting members in the vibration damping apparatus according to the first embodiment.
Figure 4B:
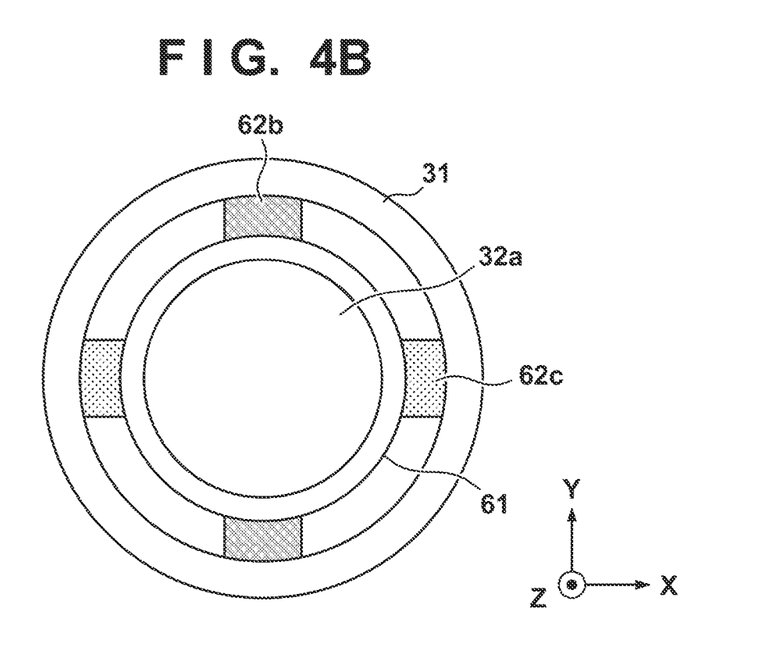

FIGS. 4A and 4B are views showing examples of the connecting members 62 in the vibration damping apparatus 60 according to the embodiment, and show states in which each example of the arrangement is seen from above (Z direction). The optical element 32b, the second holding member 65, and the damper elements 64 are not illustrated in FIGS. 4A and 4B for the sake of descriptive convenience.

In the example of the arrangement shown in FIG. 4A, a leaf spring 62a whose two ends are connected to the barrel 31 and whose center portion is connected to the first holding member 61 is arranged as each connecting member 62. A plurality of these leaf springs 62a are arranged between the barrel 31 and the first holding member 61 so as to constrain the six degrees of freedom of the optical element 32a and reduce the generation of distortion in the optical element 32a due to a thermal expansion coefficient difference between the barrel 31 and the optical element 32a. In FIG. 4A, it is possible to constrain the six degrees of freedom of the optical element 32a (the first holding member 61) and to reduce the vibration transmitted from the barrel 31 to the optical element 32a by arranging three leaf springs 62a at a pitch of 120° with respect to the first holding member 61.

In the example of the arrangement shown in FIG. 4B, a leaf spring 62b one end of which is connected to the barrel 31 and other end of which is connected to the first holding member 61 is arranged, as each connecting member 62, between the barrel 31 and the first holding member 61. The leaf springs 62b are arranged on the ±Y-direction side of the optical element 32a so as to sandwich the optical element 32a. As a result, the vibration transmitted from the barrel 31 to the optical element 32a can be reduced. In addition, an actuator 62c which drives the optical element 32a (the first holding member 61) may be arranged as each connecting member 62 between the barrel 31 and the first holding member 61. Each actuator 62c can be arranged to apply a force to the optical element 32a (the first holding member 61) in at least the Z direction. As a result, a desired deformation can be generated in the optical element 32a, and required shape correction such as, for example, the correction of the astigmatism shape which causes the astigmatism of the projection optical system 30 can be performed. For example, a contact-type element such as a piezoelectric element, a non-contact-type element such as a linear motor, or an element that causes the optical element 32a to thermally expand by applying heat may be used as each actuator 62c.

Each damper element 64 can be formed to have rigidity to support the mass body 63 (the optical element 32b and the second holding member 65) and have an attenuation characteristic that attenuates the vibration transmitted between the first holding member 61 and the mass body 63. That is, the damper element 64 can be formed from an object that has the spring constant K and the attenuation coefficient C, and formed so that the natural frequency of the mass body will be different from the natural frequency of the optical element 32a supported by the connecting members 62. Although the damper element 64 can be arranged in each of a plurality of locations (for example, three locations) between the first holding member 61 and the mass body 63 (the second holding member 65), the arrangement location of the damper element 64 can be changed arbitrarily in accordance with the rigidity of the damper element 64 and the mode of the vibration which is to be damped. In addition, the damper element 64 may be arranged between the first holding member 61 and the mass body 63 (the second holding member 65) by having a ring shape centered about the optical axis of the projection optical system 30.

A metal spring, a ceramic, a resin, a viscoelastic member (for example, a rubber member, preferably a comparatively low outgassing member such as a fluororubber), a single fibrous-material member, or a combination of these can be used as each damper element 64 in the same manner as each connecting member 62. Each damper element 64 formed in this manner may be directly attached to the first holding member 61 and the second holding member 65 by an adhesive, a bolt, or the like or may be indirectly attached to the first holding member and the second holding member via an elastic member such as a rubber sheet.

Figure 5:
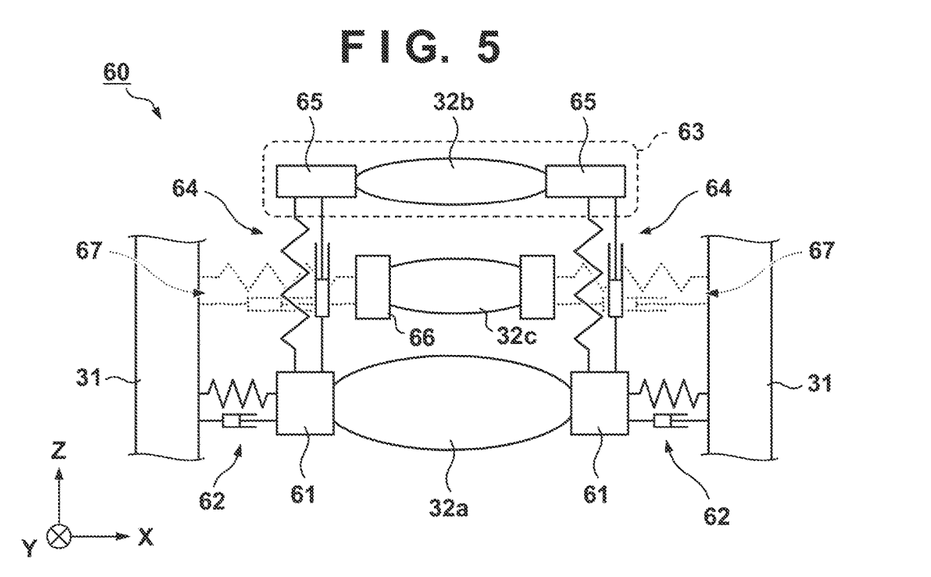
FIG. 5 is a schematic sectional view showing a modification of the vibration damping apparatus according to the first embodiment.

In this case, although the optical element 32a and the optical element 32b are adjacent to each other along the optical axis (Z direction) of the projection optical system 30 in the examples shown in FIGS. 2 and 3, the present invention is not limited to this. Another optical element 32 may be arranged between the optical element 32a and the optical element 32b. FIG. 5 is a schematic sectional view showing a modification of the vibration damping apparatus 60 according to this embodiment. An optical element 32c is arranged between the optical element 32a and the optical element 32b in the example shown in FIG. 5. As described above, the optical element 32a is supported by the first holding member 61 which is supported by the barrel 31 via the connecting members 62, and the optical element 32b is supported by the second holding member 65 which is supported by the first holding member 61 via the damper elements 64. The optical element 32c is held by a holding member 66 which is held by the barrel 31 via connecting members 67, and a vibration damping mechanism of a system different from the vibration damping mechanism of the optical element 32a and the optical element 32b is arranged for the optical element 32c.

Second Embodiment

Figure 6:
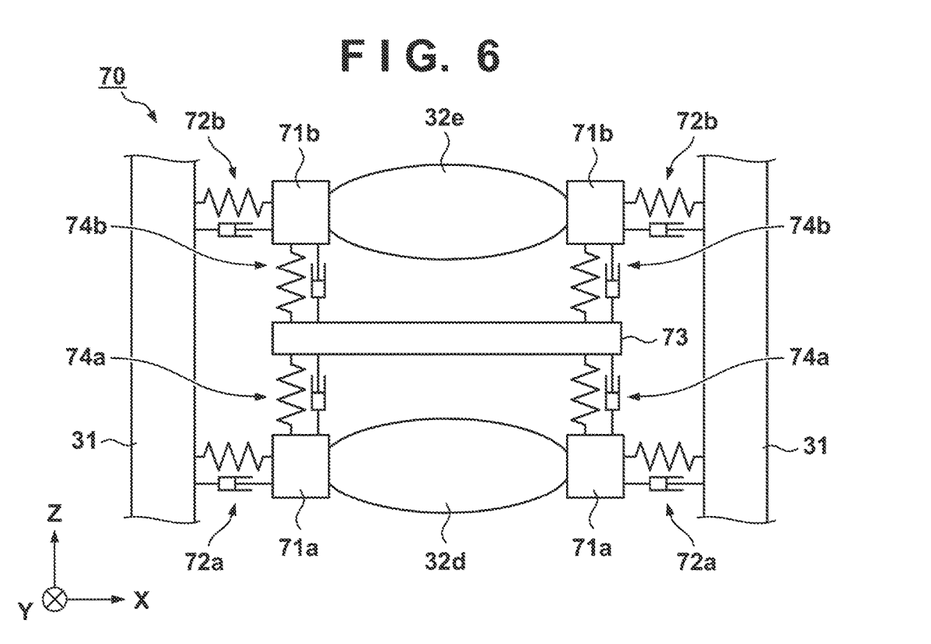
FIG. 6 is a schematic sectional view showing an example of the arrangement of a vibration damping apparatus according to the second embodiment.

A vibration damping apparatus 70 according to the second embodiment will be described with reference to FIG. 6. FIG. 6 is a schematic sectional view showing an example of the arrangement of the vibration damping apparatus 70 according to this embodiment. The vibration damping apparatus 70 according to this embodiment can include, for example, a first holding member 71a that holds an optical element 32d (a first optical element) and first connecting members 72a that connect the first holding member 71a to a barrel 31. The vibration damping apparatus 70 further includes a second holding member 71b that holds an optical element 32e (a second optical element) and second connecting members 72b that connect the second holding member 71b to the barrel 31, and a mass body 73 as a vibration damping mass. The mass body 73 is supported by the first holding member 71a via first damper elements 74a and the second holding member 71b via second damper elements 74b.

Each of the first holding member 71a and the second holding member 71b can be formed in the same manner as a first holding member 61 according to the first embodiment. Each first connecting member 72a and each second connecting member 72b can be formed in the same manner as each connecting member 62 according to the first embodiment. Each first damper element 74*a* and each second damper element 74*b* can be formed in the same manner as each damper element 64 according to the first embodiment.

The mass body 73 is formed in a ring shape having an opening for passing light at the center and is made of a material such as a ceramic or a low-thermal expansion metal having a thermal expansion coefficient equal to or less than $10^{-6}$ (1/K). This mass body 73 can be arranged between the optical element 32*d* and the optical element 32*e* as a common vibration damping mass of these optical elements. The natural frequency of the mass body 73 supported by the first damper elements 74*a* and the second damper elements 74*b* is set to be different from the natural frequency of the optical element 32*d* supported by the first connecting members 72*a* and the natural frequency of the optical element 32*e* supported by the second connecting members 72*b*. As a result, it becomes possible to quickly reduce the vibration transmitted from the barrel 31 to the optical elements 32*d* and 32*e*.

Figure 7:
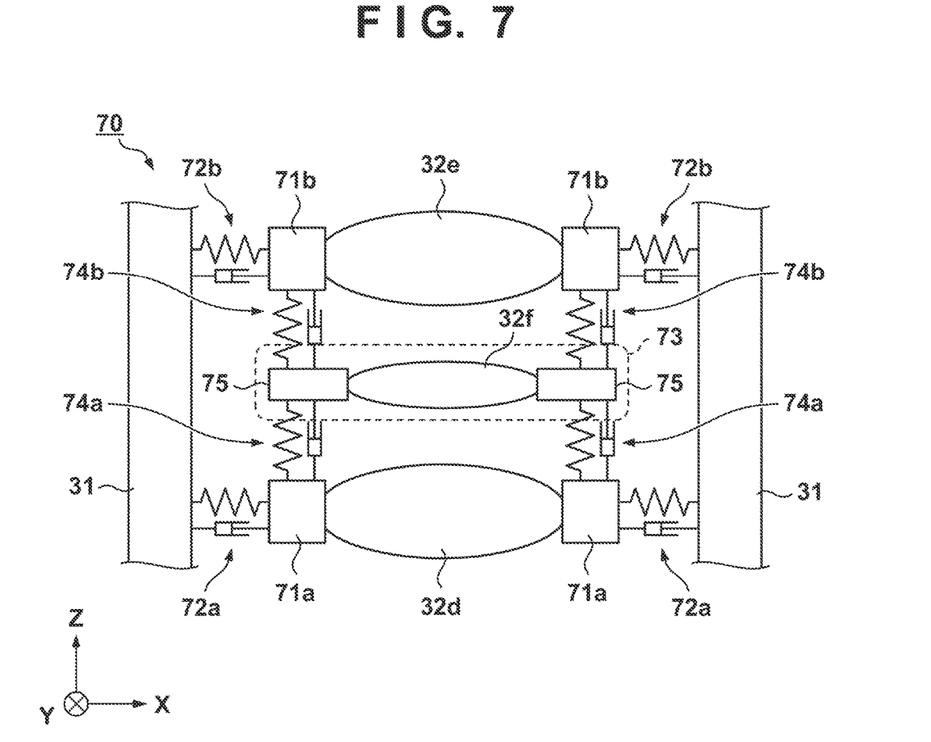
FIG. 7 is a schematic sectional view showing a modification of the vibration damping apparatus according to the second embodiment.

Although the mass body 73 can be formed in a ring shape that has an opening for passing light at the center in the above-described manner, the present invention is not limited to this. The mass body may have an arrangement obtained by dividing the mass body into a plurality of mass bodies and connecting the plurality of divided mass bodies by a spring member. In addition, as shown as in FIG. 7, the mass body may be formed so as to include an optical element 32*f* (third optical element) which is different from the optical elements 32*d* and 32*e* and a third holding member 75 which holds the optical element 32*f*. In this case, the third holding member 75 can be held by the first holding member 71*a* and the second holding member 71*b* via the first damper elements 74*a* and the second damper element 74*b*, respectively. This kind of an arrangement allows vibration damping of the optical elements to be performed by using the masses of the optical elements 32*d* to 32*f* without having to arrange a structure in the narrow space between the optical element 32*d* and the optical element 32*e* which are adjacent to each other.

In this case, if the six degrees of freedom of the optical element 32*d* (the first holding member 71*a*) are constrained excessively by the first connecting members 72*a* and the first damper elements 74*a*, it may instead generate an unintended deformation in the optical element 32*d*. In the same manner, if the optical element 32*e* (the second holding member 71*b*) is constrained excessively by the second connecting members 72*b* and the second damper elements 74*b*, it may instead generate an unintended deformation in the optical element 32*e*. Therefore, a relaxing mechanism for relaxing such excessive constraint can be arranged in at least one of the first holding member 71*a* and the second holding member 71*b*. A relaxing mechanism is a mechanism arranged to reduce the distortion generated in the optical elements 32 due to excessive constraint without largely reducing the overall support eigenvalue of the optical elements 32. For example, the relaxing mechanism can be a mechanism that has been arranged to reduce the support rigidity of the optical elements 32 in a specific direction while maintaining the support rigidity (maintaining the high rigidity) of the optical elements 32 in another direction.

Figure 8:
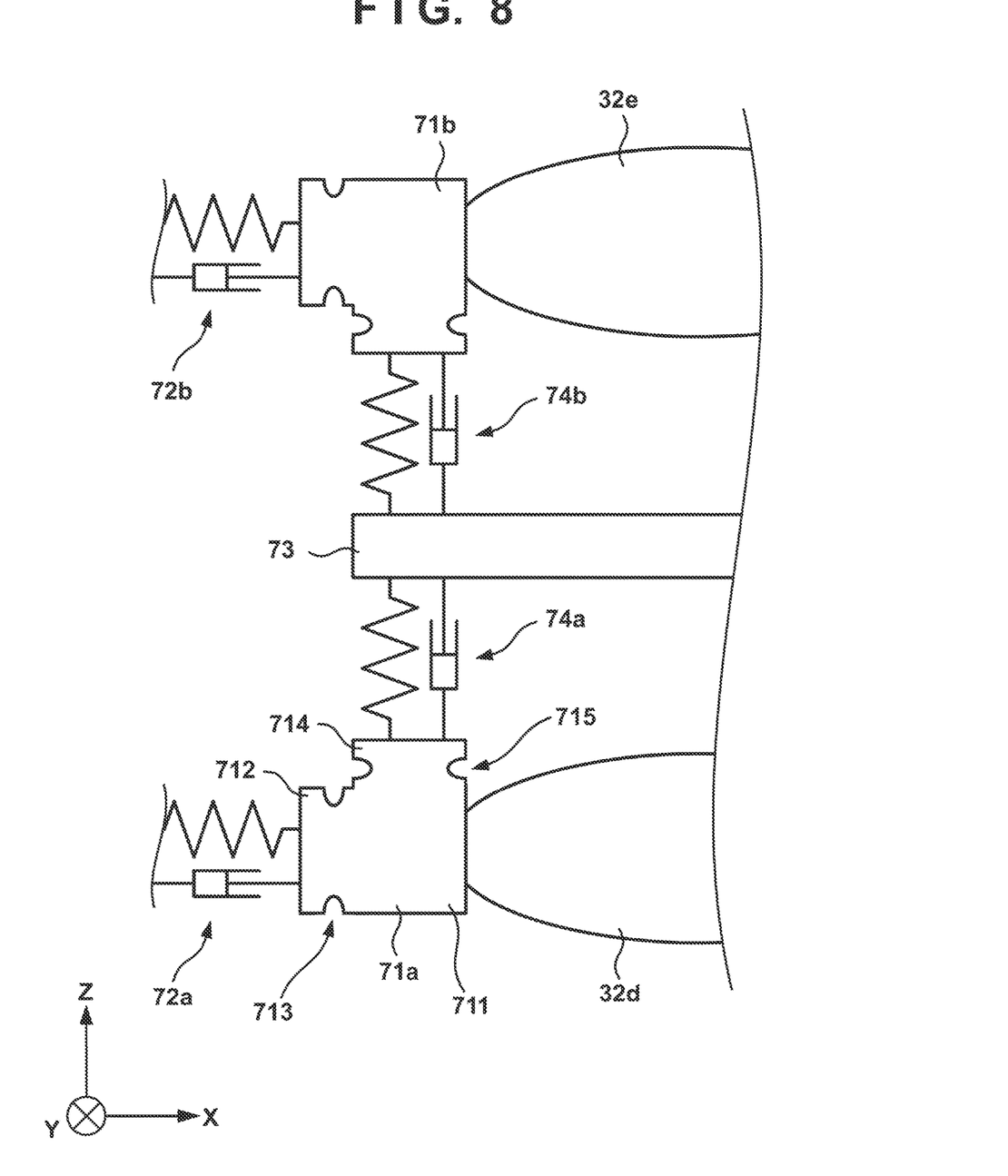
FIG. 8 is a view showing an example in which a relaxing mechanism is arranged on a holding member.

FIG. 8 is a view showing an example in which the relaxing mechanism has been added to each first holding member 71*a* and each second holding member 71*b*. The first holding member 71*a* shown in FIG. 8 includes a cutout portion 713 between a holding portion 711 of the optical element 32*d* and a connecting portion 712 to the first connecting member 72*a*, and this cutout portion 713 can function as the relaxing mechanism for relaxing the excessive constrain by the first connecting member 72*a*. The first holding member 71*a* also includes a cutout portion 715 between the holding portion 711 of the optical element 32*d* and a connecting portion 714 to the first damper element 74*a*, and this cutout portion 715 can function as the relaxing mechanism for relaxing the excessive constraint by the first damper element 74*a*. Cutout portions (relaxing mechanisms) similar to those of the first holding member 71*a* can be arranged in the second holding member 71*b*. These relaxing mechanisms may be arranged in the third holding member 75 (to be described later) and may be arranged in the first holding member 61 and the second holding member 65 of the vibration damping apparatus 60 according to the first embodiment.

Third Embodiment

Figure 9:
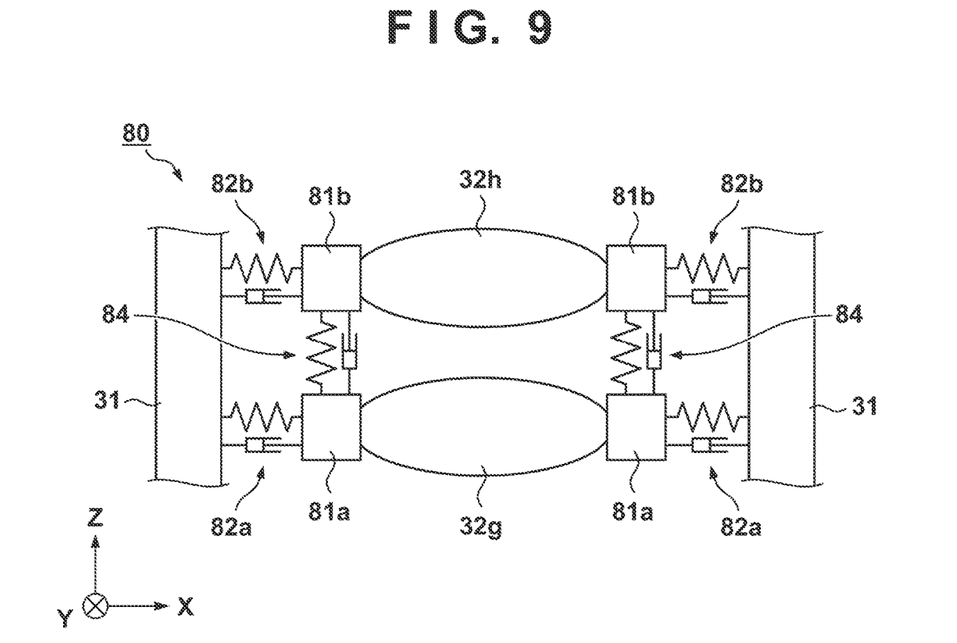
FIG. 9 is a schematic sectional view showing an example of the arrangement of a vibration damping apparatus according to the third embodiment.

A vibration damping apparatus 80 according to the third embodiment will be described with reference to FIG. 9. FIG. 9 is a schematic sectional view showing an example of the arrangement of the vibration damping apparatus 80 according to this embodiment. The vibration damping apparatus 80 according to this embodiment can include, for example, a first holding member 81*a* that holds an optical element 32*g* (first optical member) and first connecting members 82*a* that connect the first holding member 81*a* to a barrel 31. The vibration damping apparatus 80 can also include a second holding member 81*b* that holds an optical element 32*h* (second optical member) and second connecting members 82*b* that connect the second holding member 81*b* to the barrel 31. The first holding member 81*a* and the second holding member are connected to each other by damper elements 84. In this kind of an arrangement, the vibration transmitted from the barrel 31 to the optical elements 32*g* and 32*h* can be quickly reduced by making settings so that the natural frequency of the optical element 32*g* and the natural frequency of the optical element 32*h* will be different from each other.

Each of the first holding member 81*a* and the second holding member 81*b* can be formed in the same manner as a first holding member 61 according to the first embodiment. Each of the first holding member 81*a* and the second holding member 81*b* can be formed to include the relaxing mechanisms described in the second embodiment. In addition, each first connecting member 82*a* and each second connecting member 82*b* can be formed in the same manner as each connecting member 62 according to the first embodiment. Each damper element 84 can be formed in the same manner as each damper element 64 according to the first embodiment. By employing this kind of an arrangement, it becomes possible to perform vibration damping on the optical elements by using the mass of the optical elements 32*g* and 32*h* without, for example, having to arrange a structure in the narrow space between the optical element 32*g* and the optical element 32*h* which are adjacent to each other.

<Embodiment of Method of Manufacturing Article>

A method of manufacturing an article according to the embodiments of the present invention is suitable for manufacturing an article such as a microdevice such as a semiconductor device or an element having a microstructure. The method of manufacturing an article according to the embodiments includes a step of exposing a substrate by using the above-described lithography apparatus (exposure apparatus), and a step of processing (for example, performing an etching process) the substrate exposed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-042301 filed on Mar. 8, 2018, which is hereby incorporated by reference herein in its entirety.

What is claimed is:

1. A vibration damping apparatus that performs vibration damping of a first optical element among a plurality of optical elements arranged in a barrel, comprising:
   a holding member connected to the barrel and configured to hold the first optical element; and
   a mass body spaced apart from the barrel and supported by the holding member via a damper element,
   wherein the mass body includes a second optical element arranged in the barrel and different from the first optical element among the plurality of optical elements.

2. The apparatus according to claim 1, further comprising a connecting member configured to connect the barrel and the holding member so as to attenuate the vibration from the barrel.

3. The apparatus according to claim 2, wherein the holding member includes a cutout portion between a holding portion of the first optical element and a connecting portion to the connecting member.

4. The apparatus according to claim 2, wherein the holding member includes a cutout portion between a holding portion of the first optical element and a connecting portion to the damper element.

5. The apparatus according to claim 2, wherein a natural frequency of the mass body supported by the damper element is different from a natural frequency of the first optical element supported by the connecting member.

6. The apparatus according to claim 1, wherein the first optical element and the second optical element have different changing amounts of optical characteristics from each other with respect to a positional fluctuation amount.

7. The apparatus according to claim 1, wherein the first optical element and the second optical element have different masses from each other.

8. The apparatus according to claim 1, wherein the first optical element and the second optical element have different refractive powers from each other.

9. A lithography apparatus that forms a pattern on a substrate, comprising:
   an optical system that includes a plurality of optical elements arranged in a barrel; and
   a vibration damping apparatus configured to perform vibration damping on a first optical element among the plurality of optical elements arranged in the barrel,
   wherein the vibration damping apparatus includes:
     a holding member connected to the barrel and configured to hold the first optical element; and
     a mass body spaced apart from the barrel and supported by the holding member via a damper element, and
   wherein the mass body includes a second optical element different from the first optical element among the plurality of optical elements.

10. A method of manufacturing an article, the method comprising:
   forming a pattern on a substrate using a lithography apparatus;
   processing the substrate, on which the pattern has been formed, to manufacture the article,
   wherein the lithography apparatus that forms a pattern on the substrate, comprising:
     an optical system that includes a plurality of optical elements arranged in a barrel; and
     a vibration damping apparatus configured to perform vibration damping on a first optical element among the plurality of optical elements arranged in the barrel,
   wherein the vibration damping apparatus includes:
     a holding member connected to the barrel and configured to hold the first optical element; and
     a mass body spaced apart from the barrel and supported by the holding member via a damper element, and
   wherein the mass body includes a second optical element different from the first optical element among the plurality of optical elements.

11. A vibration damping apparatus that performs vibration damping on a first optical element and a second optical element among a plurality of optical elements arranged in a barrel, comprising:
   a first holding member connected to the barrel and configured to hold the first optical element;
   a second holding member connected to the barrel and configured to hold the second optical element; and
   a mass body connected to the first holding member via a first damper element and to the second holding member via a second damper element.

12. The apparatus according to claim 11, wherein the mass body includes a third optical element different from the first optical element and the second optical element among the plurality of optical elements.

13. The apparatus according to claim 11, further comprising:
a first connecting member configured to connect the first holding member and the barrel so as to attenuate the vibration from the barrel; and
a second connecting member configured to connect the second holding member to the barrel so as to attenuate the vibration from the barrel.

14. The apparatus according to claim 13, wherein a natural frequency of the mass body supported by the first damper element and the second damper element is different from a natural frequency of the first optical element supported by the first connecting member and a natural frequency of the second optical element supported by the second connecting member.

15. A lithography apparatus that forms a pattern on a substrate, comprising:
an optical system that includes a plurality of optical elements arranged in a barrel; and
a vibration damping apparatus configured to perform vibration damping on a first optical element and a second optical element among the plurality of optical elements arranged in the barrel,
wherein the vibration damping apparatus includes:
a first holding member connected to the barrel and configured to hold the first optical element;
a second holding member connected to the barrel and configured to hold the second optical element; and
a mass body connected to the first holding member via a first damper element and to the second holding member via a second damper element.

16. A method of manufacturing an article, the method comprising:
forming a pattern on a substrate using a lithography apparatus;
processing the substrate, on which the pattern has been formed, to manufacture the article,
wherein the lithography apparatus that forms a pattern on a substrate, comprising:
an optical system that includes a plurality of optical elements arranged in a barrel; and
a vibration damping apparatus configured to perform vibration damping on a first optical element and a second optical element among the plurality of optical elements arranged in the barrel, and
wherein the vibration damping apparatus includes:
a first holding member connected to the barrel and configured to hold the first optical element;
a second holding member connected to the barrel and configured to hold the second optical element; and
a mass body connected to the first holding member via a first damper element and to the second holding member via a second damper element.

17. A vibration damping apparatus that performs vibration damping on a first optical element and a second optical element among a plurality of optical elements arranged in a barrel; comprising:
a first holding member connected to the barrel and configured to hold the first optical element; and
a second holding member connected to the barrel and configured to hold the second optical element,
wherein the first holding member and the second holding member are connected to each other by a damper element.

18. The apparatus according to claim 17, further comprising:
a first connecting member configured to connect the first holding member and the barrel so as to attenuate the vibration from the barrel; and
a second connecting member configured to connect the second holding member and the barrel so as to attenuate the vibration from the barrel.

19. The apparatus according to claim 18, wherein a natural frequency of the first optical element supported by the first connecting member and a natural frequency of the second optical element supported by the second connecting member are different from each other.

20. A lithography apparatus that forms a pattern on a substrate, comprising:
an optical system including a plurality of optical elements arranged in a barrel; and
a vibration damping apparatus configured to perform vibration damping on a first optical element and a second optical element among the plurality of optical elements arranged in the barrel,
wherein the vibration damping apparatus includes:
a first holding member connected to the barrel and configured to hold the first optical element; and
a second holding member connected to the barrel and configured to hold the second optical element, and
wherein the first holding member and the second holding member are connected to each other by a damper element.

21. The apparatus according to claim 1, wherein each of the plurality of optical elements is at least one of a lens, a mirror, a diffraction grating and a parallel plate.

22. The apparatus according to claim 1, wherein the plurality of optical elements is arranged in the barrel of a projection optical system for projecting a pattern of a mask onto a substrate, or an illumination optical system for illuminating the mask.

23. The apparatus according to claim 11, wherein the mass body is spaced apart from the barrel.

24. The apparatus according to claim 11, further comprising:
the first damper element configured to connect the mass body and the first holding member to each other without interposing the barrel;
the second damper element configured to connect the mass body and the second holding member to each other without interposing the barrel.

25. The apparatus according to claim 17, further comprising the damper element configured to connect the first holding member and the second holding member to each other without interposing the barrel.

* * * * *